United States Patent [19]

Todokoro

[11] 4,099,055
[45] Jul. 4, 1978

[54] SCANNING TRANSMISSION ELECTRON MICROSCOPE

[75] Inventor: Hideo Todokoro, Tokyo, Japan

[73] Assignee: Hitachi, Ltd., Japan

[21] Appl. No.: 730,854

[22] Filed: Oct. 8, 1976

[30] Foreign Application Priority Data

Oct. 17, 1975 [JP] Japan .................. 50-124386

[51] Int. Cl.² ........................................ H01J 37/26
[52] U.S. Cl. ........................................ 250/311
[58] Field of Search .............. 250/305, 306, 307, 310, 250/311, 397, 505

[56] References Cited

U.S. PATENT DOCUMENTS

| | | | |
|---|---|---|---|
| 2,464,419 | 3/1949 | Smith | 250/307 |
| 3,626,184 | 3/1970 | Crewe | 250/310 |
| 3,835,246 | 9/1974 | Muller et al. | 250/311 |
| 3,857,034 | 12/1974 | Hoppe | 250/310 |
| 3,889,114 | 6/1975 | Oostrum | 250/306 |

Primary Examiner—Davis L. Willis
Assistant Examiner—B. Anderson
Attorney, Agent, or Firm—Craig & Antonelli

[57] ABSTRACT

A scanning transmission electron microscope includes means for irradiating with a finely focussed electron beam a sample to be observed within an evacuated chamber, means for scanning the surface of said sample with said electron beam, means for transducing an image of electron beam passed through said sample into an image formed by the light beam, light transmission means for transmitting said light beam image to the outside of said evacuated chamber, light interrupting means adapted to allow a selected part of said light beam image to pass while interrupting the other part of said image and light detecting means adapted to detect said part of said light beam which is allowed by said interrupting means to pass.

5 Claims, 8 Drawing Figures

SCANNING TRANSMISSION ELECTRON MICROSCOPE

BACKGROUND OF THE INVENTION

The present invention relates to an improvement in a scanning transmission electron microscope and, more particularly, to an improvement in means for detecting electrons which have passed through a sample, in a microscope of such a type.

DESCRIPTION OF THE PRIOR ART

In conventional microscopes of the scanning transmission electron type, a sample to be observed is scanned by a finely focussed primary electron beam. The electron beam passed through the sample is suitably detected, and the detected signal is supplied to a cathode ray tube (hereinafter, will be referred to simply as CRT) adapted to perform a scanning synchronously with said primary electron beam, through an intensity modulation input terminal of said CRT, so that an image of the sample is displayed on the screen of the CRT, through an intensity modulation in accordance with the intensity of the electron beam passed through the sample.

To explain in more detail, the electron beam passed through the sample contains electrons which have been scattered in the sample and electrons which have not been scattered. The scattered electrons are further divided into those which have been scattered elastically and those which have been scattered non-elastically.

Recently, an attempt has been made, in order to obtain a more detailed informations with image of the sample, to separately detect those three kinds of electrons, employing various types of electron-detecting means as, for example, proposed in the specification of U.S. Pat. No. 3,626,184.

A typical scanning transmission electron microscope having such means capable of detecting those electrons separately is shown in FIG. 1. Referring to FIG. 1, a chamber 24 defined by a vacuum-tight wall 25 is highly evacuated by evacuation pumping means which are not shown.

Within the evacuated chamber 24, there is disposed a sample 8 to be observed, above which there is located means for irradiating the primary electron beam. The electron beam irradiating means includes an electron gun, a focussing lens and a deflecting coil. The electron gun is normally of the field emission type.

The electron gun of the field emission type includes a cathode 1, a first anode 3 and a second anode 5. An electric source 2 for effecting electron emission is provided between the cathode 1 and the first anode 3, while another electric source 4 is provided between the second anode 5 and the cathode 1 for the purpose of acceleration of the emitted electron. The second anode 5 is normally grounded.

In the illustrated arrangement, a strong field is formed around the extreme tip end of the cathode 1 causing emission of electrons therefrom, while a positive potential of some +3KV is applied to the first anode 3, with respect to the cathode 1. The electrons thus emitted are therefore accelerated and energized by the influence of the acceleration potential of 50 to 100 KV applied between the cathode 1 and the second anode 5 and thereby form the primary electron beam 41.

The electron beam 41 is then focussed by the focussing lens 6 and is irradiated onto the surface of the sample 8 as a fine spot. The position of the spot where the focussed electron beam is irradiated is moved by a deflection coil 7, to provide a two-dimensional scanning, which is adapted to be supplied with a deflecting electric current by a scanning signal source 12.

Since the sample 8 is usually extremely thin, typically 1000 A, almost all of the electrons irradiated onto the sample pass therethrough. The difference in thickness, partial condition or atomic composition of the sample provides a different intensity to the electrons which have passed through the sample, as well as a different angle of scattering. Therefore, the information about the sample is obtained through observing and analysing the intensity and the angle of scattering of the electrons.

In order to obtain more detailed information through the above explained principle, the microscope of FIG. 1 is equipped with a bright-field detector 23 adapted to detect those electrons which have not been scattered (non-scattered or bright-field electrons) 42A and a dark-field detector 22 capable of detecting those electrons which have been scattered (scattered or darkfield electrons) 42B.

The dark-field detector 22 includes a thin layer 9 of a substance adapted to illuminate upon receipt of an electron impact, such as a fluorescent substance, photo-electric detecting means 11 adapted to detect the light emitted from the luminous layer 9, such as a photo-multiplier tube and a light, guide such as a prism 10 adapted to guide the light emitted from the luminous layer 9 to the photoelectric detector 11.

At the center of the luminous layer 9, there is provided a circular opening 9A through which the non-scattered or bright-field electrons 42A pass, so that the luminous layer 9 is sensitive only to the scattered or dark-field electrons 42B. Accordingly, the output from the photoelectric detector 11 corresponds only to the intensity of the dark-field electrons 42B.

The bright-field detector 23 includes a thin layer 13 of luminous substance such as fluorescent substance, a light guide 14, and a photoelectric detector 15. The luminous layer 13 receives only the bright-field electrons 42A, so that the output from the photoelectric detector 15 corresponds only to the intensity of the bright-field electrons 42A.

The output signals from the bright-field detector 23 and the dark-field detector 22 are delivered to a change-over switch 16 adapted to select one of the output signals for inputting to an amplifier 17 which in turn is adapted to deliver the amplified signal to an intensity modulation input terminal 20 of a CRT 18. Since the scanning coil 19 of the CRT 18 is supplied with a current, by the scanning signal source 12, which is in proportion to the current supplied to the deflector coil 7 for scanning the primary electron beam 1, a two-dimensional scanning of the electron beam of the CRT 18 is performed in synchronization with the primary electron beam 41.

Therefore, a bright-field image, i.e. the image formed by the bright-field electrons, is displayed on the screen of the CRT 18 when the intensity modulation terminal 20 is supplied with the output signal from the bright-field detector 23, while a dark-field image, i.e. the image formed by the dark-field electrons is displayed on the screen when the output signal from the dark-field detector 22 is supplied to the terminal 20. It is, of course, possible to employ two CRTs to simultaneously obtain both of the dark- and the bright-field images.

The central opening 9A of the luminous layer 9 must be strictly concentric with the central axis of the transmitted electron beam. To this end, the dark-field detector 22 is disposed displaceably within a horizontal plane.

In most cases, a masking plate 21 having a circular central opening 21A is provided at just above a luminous layer 13 of the bright-field detector 23. The masking plate 21 is for interrupting the peripheral portion of the electron beam 42A passed through the central opening 9A of the luminous layer 9, and for allowing the central portion 42C to pass therethrough, thereby to improve the contrast of the bright-field image. The contrast can be adjusted by varying the diameter of the central opening 21A. The masking plate 21 is also disposed displaceably within a horizontal plane, for centering the opening 21A to the optical axis of the bright-field electron beam 42A.

Although this arrangement can provide a qualified observation of the image, the structure is complicated and expensive due to the presence of two detectors, i.e. the dark- and the bright-field detectors 22 and 23.

At the same time, the structure is also complicated by the provision of movable parts in the evacuated chamber 24 for displacing the dark-field detector 22 and for displacing and changing the masking plate 21, and the handling and the adjustment are accordingly difficult and troublesome.

SUMMARY OF THE INVENTION

It is therefore an object of the invention to provide an improved scanning transmission electron microscope which is simplified in structure and which can be handled without difficulty, while maintaining a qualified observation performance.

It is another object of the invention to provide an improved scanning transmission electron microscope capable of detecting the bright-field and the dark-field electrons separately, by using a single detecting means.

It is still another object of the invention to provide a scanning transmission electron microscope which requires substantially no moving or displaceable adjusting means within the evacuated chamber.

To these ends, according to the invention, there is provided a scanning transmission electron microscope characterized by means for generating a light image in accordance with the distribution of the electrons upon receipt of all of electrons which have passed through a sample to be observed, means for leading the generated light image out from the evacuated chamber, means for interrupting a part of the led out light image while allowing the remaining part to pass therethrough and photoelectric detecting means adapted to detect the light passed by said interrupting means.

It is to be noted that the interrupting means disposed outside of the evacuated chamber provides separated detections of the light image corresponding to the bright- and the dark-field electrons. Thus, only one detector is required for detecting the electrons which have passed through the sample, and the movable adjusting means in the evacuated chamber are dispensed with.

These and other objects, features and advantageous effects of the invention will become clear from the following description of preferred embodiments taken in conjunction with the attached drawings.

DESCRIPTION OF THE PREFERRED EMBODIMENTS

Figure 1:
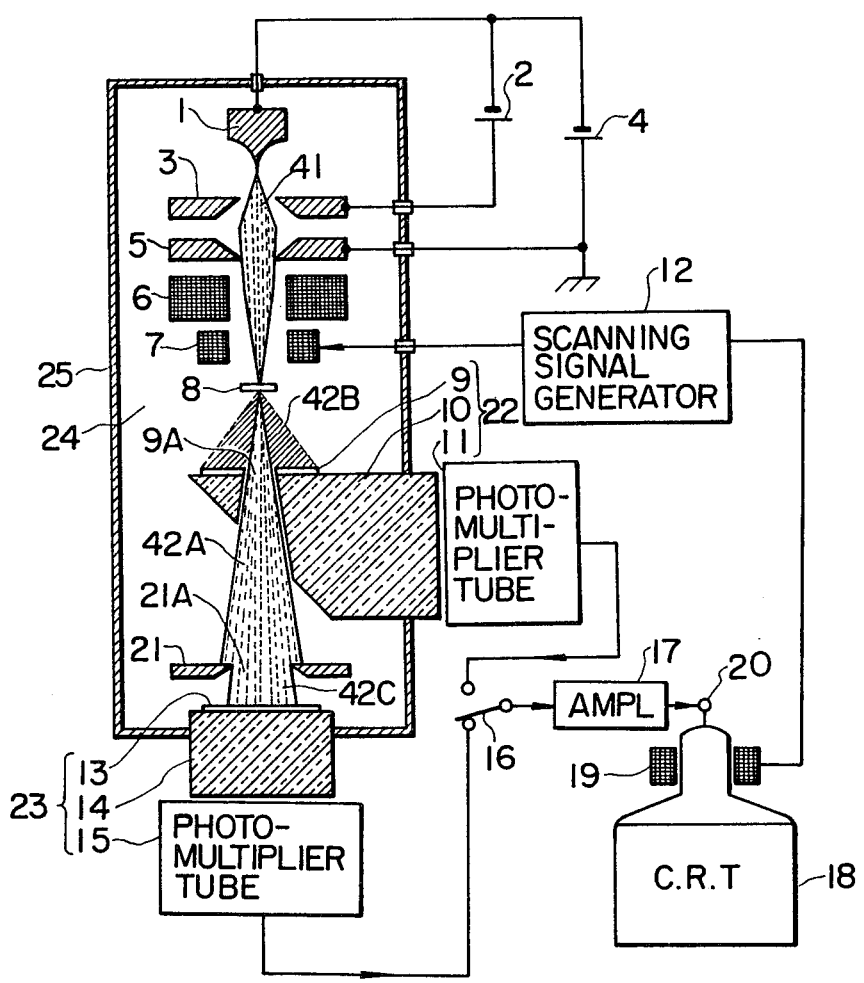
FIG. 1 is a sectional view of a conventional microscope of scanning transmission electron type.
Figure 2:
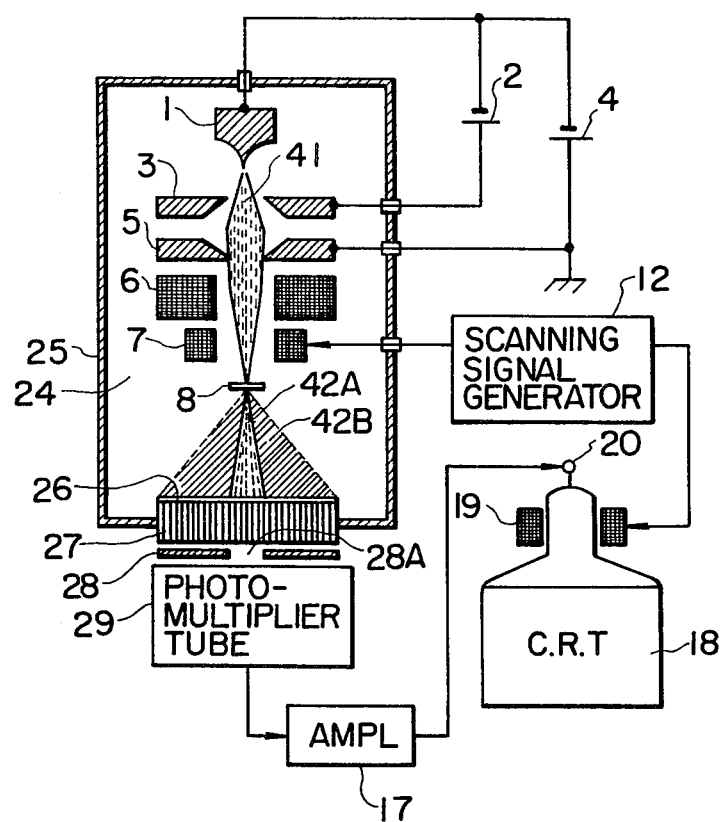
FIG. 2 is a sectional view showing a general arrangement of a scanning transmission electron microscope in accordance with the present invention.

Referring to FIG. 2 showing a practical embodiment of the present invention, the same primary electron beam irradiating means as those of FIG. 1 are employed for irradiating a finely focussed primary electron beam with which the sample 8 to be observed is scanned.

In the microscope of the invention, all of the electrons passed through the sample are applied onto a luminous layer 26 which consists of a substance such as a fluorescent substance capable of illuminating upon receipt of an electron impact. Accordingly an image is formed on the luminous layer of an intensity distribution corresponding to the intensity distribution of the electrons which have passed through the sample.

The light image thus formed is led, by means of a light transmitting medium 27, out of the evacuated chamber 24. A fiber plate is preferably used as the light transmitting medium, for the purpose of transmitting the intensity distribution of the light image with as high fidelity as possible, although other means capable of transmitting the image on the luminous layer 26 out of the evacuated chamber may be used. The term "fiber plate" is used here to mean a plate consisting of a plurality of parallely arranged fine optic fibers capable of transmitting a light image input from its one side to the other side with a high fidelity. Needless to say, a transparent plate, such as a glass plate, or a plastic plate may be used as the light transmitting plate. Thus, the light image generated in the evacuated chamber is transmitted to the end surface of the light transmitting medium, which end being outside of the evacuated chamber. The transmitted image has an intensity distribution corresponding to the intensity distribution of electrons which have passed through the sample.

Figure 3:
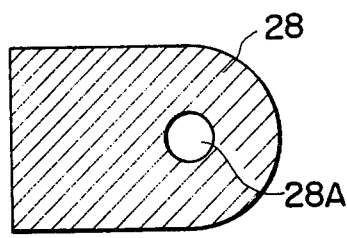
FIG. 3 is a cross-sectional view of an example of dark-field electron interrupting plate used for the observation of a bright-field image in the scanning transmission electron microscope of the present invention.

To the end surface of the light transmitting medium 27, facing an input surface of a photoelectric detector 29, there is interposed a light interrupting plate 28. The light interrupting plate 28 has a central circular opening 28A as will be seen most clearly from FIG. 3. Therefore, only the part of the light which has passed through the central opening 28A is received by the photoelectric detector 29, while the other part is interrupted.

Therefore, by adjusting the diameter and the position of the central opening 28A, it is possible to apply only the part of the light image corresponding to the bright-field electrons 42A to the photoelectric detector 29.

The plate 28 is therefore referred to as a dark-field interrupting plate and is used for the observation of the bright-field image.

Consequently, the output from the photoelectric detector 29 corresponds to the intensity of only the bright-field electrons 42A. In other words, the detector 29 acts as a bright-field detector.

The output from the photoelectric detector 29 is amplified by an amplifier 17 and is delivered to an intensity modulation input terminal 20 of a CRT 18.

Since the electron beam in the CRT 18 makes a scanning, by a deflecting current provided by a scanning signal source 12, synchronously with the primary electron beam 41, a bright-field image corresponding to the intensity of the bright-field electrons 42A is formed on the screen of the CRT 18.

Figure 4:
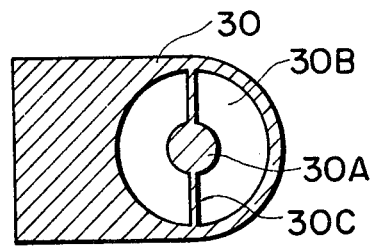
FIG. 4 is a cross-sectional view of an example of bright-field interrupting plate used for the observation of the dark-field image.

To the contrary, if it is desired to obtain the dark-field image, a bright-field interrupting plate 30 having a shape as shown in FIG. 4 is used in place of the dark-field interrupting plate 28. The bright-field interrupting plate 30 has a central light interrupting part 30A adapted to interrupt the part of the light image corresponding to the bright-field electrons 42A and a peripheral annular opening 30B for allowing the dark-field electrons to pass therethrough, as well as arms 30C to support the central interrupting part. It will be understood that this bright-field interrupting plate 30 provides an output from the photoelectric detector 29 in accordance with the intensity of the dark-field electrons 42B. Thus, the detector 29 in this case acts as a dark-field detector which provides a dark-field image on the CRT 18 corresponding to the intensity of the dark-field electrons 42B.

It will be clear from the foregoing description that the bright-field and the dark-field images can be selectively and alternatingly observed through changing the light interrupting plates, by a single photoelectric detector. In addition, the contrast of the bright-field image can conveniently be controlled by varying the diameter of the central opening 28A of the dark-field interrupting plate 28. The changing of the interrupting plate and other required adjustment, such as centering, can advantageously be performed at the outside of the evacuated chamber, so that the structure is reduced in size and simplified to provide an accordingly simplified operation or handling.

Figure 5A:
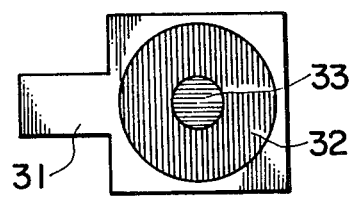
FIG. 5A and FIG. 5B are plan view explanatory of a light interrupting means utilizing polarizing plates.
Figure 5B:
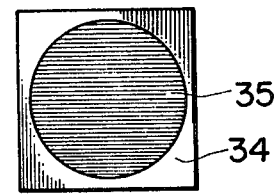

FIGS. 5A and 5B show another example of an interrupting plate arrangement in which two polarizing plates are incorporated, one of which being rotatable to provide the changing-over between the dark-field and the bright-field image observations.

Referring to FIGS. 5A and 5B, a first polarizing plate consists of, as shown in FIG. 5A, a ring-like polarizing element 32 carried by a holder 31 and a disk-like polarizing element 33 disposed in the central opening of the ring-like element 32.

The arrangement is such that each of the polarizing elements 32 and 33 has a respective direction of polarization which is orthogonal with respect to the other.

A second polarizing plate consists of, as shown in FIG. 5B, a disk-like polarizing element 35 carried by a holder 34.

Supposing here that the diameter of the polarizing element 33 is equal to that of the part of the image formed by the bright-field electrons, when the two polarizing plates are superimposed and disposed between the light transmitting medium 27 and the photoelectric detector 29, the light corresponding to the bright-field electrons 42A is allowed to pass through the region of the polarizing element 33, while the light corresponding to the dark-field electrons 42B is interrupted, if the plates are arranged to provide a parallel direction of polarization of the polarizing element 33 and the polarizing element 35.

Thus, in this case, the two polarizing plates are capable of performing the function of a dark-field interrupting plate, and the photoelectric detector 29 acts as a bright-field detector, to provide a display of the bright-field image on the CRT 18.

In order to observe the dark-field image, the second polarizing plate is simply rotated through 90° so that the directions of polarization of the elements 32 and 35 become parallel with each other. Consequently, only the light corresponding to the dark-field electrons is allowed to pass through the region of the polarizing element 32, while the light corresponding to the bright-field electrons is interrupted, to reach the photoelectric detector 29.

Thus, in this case, the two polarizing plates act as a bright-field interrupting plate, while the photoelectric detector 29 acts as a dark-field detector, to provide a display of the dark-field image on the CRT 18.

The interrupting plate of FIGS. 5A and 5B advantageously provides the switching between the bright-field observation and the dark-field observation by a simple operation of rotation of one of the polarizing plates.

Figure 6:
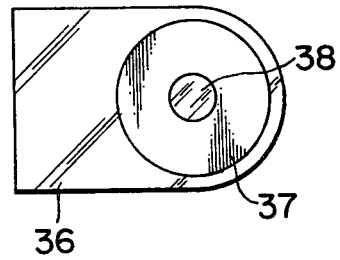
FIG. 6 is a plan view of another example of the dark-field image interrupting plate.
Figure 7:
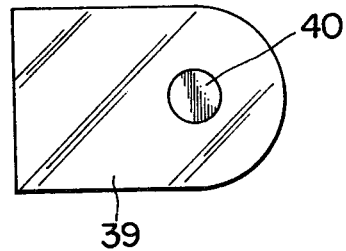
FIG. 7 is a plan view of another example of the bright-field image interrupting plate.

FIGS. 6 and 7 show different examples of the dark-field interrupting plate and the bright-field interrupting plate, respectively.

Referring to FIG. 6, a modification of the dark-field interrupting plate includes a light-transmitting substrate plate 36 such as a glass plate or a plastic plate on which there is formed a ring-like light shielding portion 37 defining a central circular light transmitting portion 38 capable of passing the light corresponding only to the bright-field electrons 42A to the photoelectric detector 29.

The light-shielding portion 37 may be formed with a light-shielding thin plate adhered to the substrate 36, or may be a light-shielding thin plate secured on the substrate 36 by means of, for example, evaporation depositing.

Alternatively, a photographic film may be used as the substrate, a part of which is previously turned black to form the light-shielding portion 37.

The bright-field interrupting plate of FIG. 7 has a circular light-shielding portion 40 formed on a light-transmitting substrate 39 to interrupt the light corresponding to the bright-field electrons 42A.

According to the invention, additional advantageous effects are given as follows.

Namely, the centering of the electro-optical system can accurately be performed by observing directly the light image produced by all of the electrons having passed through the sample, which image is visibly given on the end surface of the light transmitting medium 27, which end is located outside of the evacuated chamber 24.

At the same time, an electron diffraction image is available at the end surface of the light-transmitting medium 27, by stopping the scanning by the primary electron beam to apply the latter on a point of a sample, the diffraction image being ready for photographing.

Moreover, it will be understood from the foregoing description that the present invention provides a scanning transmission electron microscope which is reduced in size and simplified in structure, and which can be handled easily, since a single detector in cooperation with the changeable interrupting plates provides the observations of the bright-field and the dark-field images, by simple operation of changing the interrupting plates which can be made at the outside of the evacuated chamber, as well as the centering of the system, without being accompanied by the deterioration of the performance.

Although a specific embodiment has been described, solely for the purpose of illustration it is to be understood that many changes and modifications may be imparted thereto without departing from the scope of the present invention which is limited by the appended claims.

What is claimed is:

1. A scanning transmission electron microscope comprising means for irradiating with a finely focussed primary electron beam, a sample to be observed with an evacuated chamber, means for scanning said sample with said primary electron beam, means for converting the electrons passing through said sample to a light image, light transmitting means for transmitting said light image out of said evacuated chamber, light interrupting means for passing a selected part of said transmitted light image while interrupting the remaining part, and photoelectric detecting means for detecting the light which has passed through said light interrupting means to detect bright or dark-field electrons.

2. A scanning transmission electron microscope as claimed in claim 1 characterized in that said light interrupting means includes means for passing only that part of said transmitting light image generated by those electrons which have not been scattered in said sample, while blocking the part corresponding to those electrons which have been scattered in said sample.

3. A scanning transmission electron microscope as claimed in claim 1 characterized in that said light interrupting means includes means for passing only that part of said transmitted light image generated by those electrons scattered in said sample while interrupting the part of said image corresponding to those electrons which have not been scattered.

4. A scanning transmission electron microscope as claimed in claim 1 characterized in that said means for irradiating said sample with a primary electron beam comprises an electron gun of the field emission type.

5. A scanning transmission electron microscope as claimed in claim 1 characterized in that said light-interrupting means comprise a first polarizing plate having a ring-like polarizing element and a disk-line polarizing element disposed in the central opening of said ring-like polarizing element, the directions of polarization of said elements being orthogonally arranged with respect to each other, and a second polarizing plate superimposed on said first polarizing plate, said second polarizing plate consisting of a single polarizing element.

* * * * *